(12) United States Patent
Minoda et al.

(10) Patent No.: US 10,634,995 B2
(45) Date of Patent: Apr. 28, 2020

(54) POSITION DETECTOR, POSITION DETECTION METHOD, IMPRINT APPARATUS, AND PRODUCT MANUFACTURING METHOD

(71) Applicant: CANON KABUSHIKI KAISHA, Tokyo (JP)

(72) Inventors: Ken Minoda, Utsunomiya (JP); Takafumi Miyaharu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 321 days.

(21) Appl. No.: 15/583,822

(22) Filed: May 1, 2017

(65) Prior Publication Data
US 2017/0329217 A1 Nov. 16, 2017

(30) Foreign Application Priority Data

May 10, 2016 (JP) ................... 2016-094830

(51) Int. Cl.
| | | |
|---|---|---|
| *G03F 7/00* | (2006.01) | |
| *G03F 9/00* | (2006.01) | |
| *G01D 5/38* | (2006.01) | |
| *G05B 19/19* | (2006.01) | |
| *G01B 11/25* | (2006.01) | |

(Continued)

(52) U.S. Cl.
CPC ............. *G03F 7/0002* (2013.01); *G01D 5/38* (2013.01); *G03F 9/7042* (2013.01); *G05B 19/19* (2013.01); *B29L 2011/00* (2013.01); *G01B 11/254* (2013.01); *G01D 5/18* (2013.01); *G03F 9/7038* (2013.01); *G03F 9/7049* (2013.01); *G03F 9/7069* (2013.01); *G03F 9/7076* (2013.01); *G05B 2219/37558* (2013.01); *G06T 7/0004* (2013.01); *G06T 2207/30148* (2013.01); *H01L 21/304* (2013.01)

(58) Field of Classification Search
CPC .... G03F 7/0002; G03F 9/7049; G03F 9/7038; G03F 9/7076; G03F 9/7069; G01B 11/254; G05B 19/19; G05B 2219/37558; H01L 21/304; G06T 7/0004; G06T 2207/30148; G01D 5/18; G01D 5/38; B29L 2011/00
USPC ................................ 264/40.1; 425/150, 385
See application file for complete search history.

(56) References Cited

U.S. PATENT DOCUMENTS

| | | | | |
|---|---|---|---|---|
| 2012/0328725 A1* | 12/2012 | Minoda | ................. | G03F 7/0002 425/150 |
| 2013/0271740 A1* | 10/2013 | Quintanilha | ............ | G03F 1/144 355/67 |

FOREIGN PATENT DOCUMENTS

| | | |
|---|---|---|
| JP | 2013-030757 A | 2/2013 |
| JP | 2015-154008 A | 8/2015 |
| JP | 2016-027325 A | 2/2016 |

* cited by examiner

*Primary Examiner* — Joseph S Del Sole
*Assistant Examiner* — Lawrence D. Hohenbrink, Jr.
(74) *Attorney, Agent, or Firm* — Canon U.S.A., Inc., IP Division

(57) ABSTRACT

A position detector includes a detection unit configured to detect light from a first diffraction grating including a first pattern disposed in a first direction, and light from a second diffraction grating including a second pattern disposed in the first direction, and a control unit configured to obtain a relative position between the first and the second diffraction gratings based on the light detected by the detection unit. The position detector has a third pattern formed in a second direction different from the first direction at edges of the first pattern of the first diffraction grating, the third pattern has a (Continued)

width smaller than a width of the first pattern of the first diffraction grating.

8 Claims, 18 Drawing Sheets

(51) Int. Cl.
*G01D 5/18* (2006.01)
*B29L 11/00* (2006.01)
*G06T 7/00* (2017.01)
*H01L 21/304* (2006.01)

~31

~32

FIG. 7A
FIG. 7B
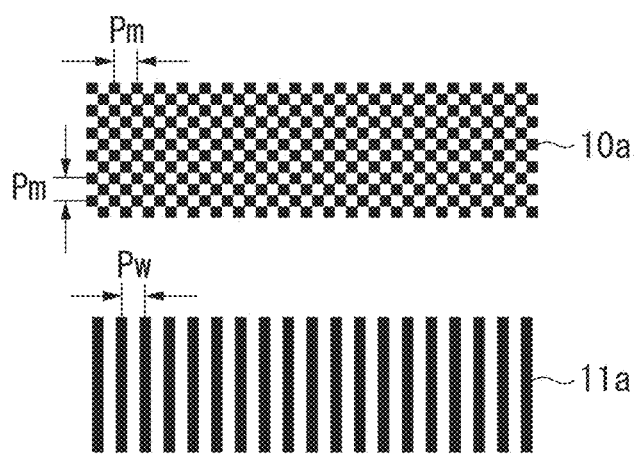
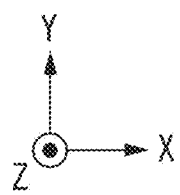

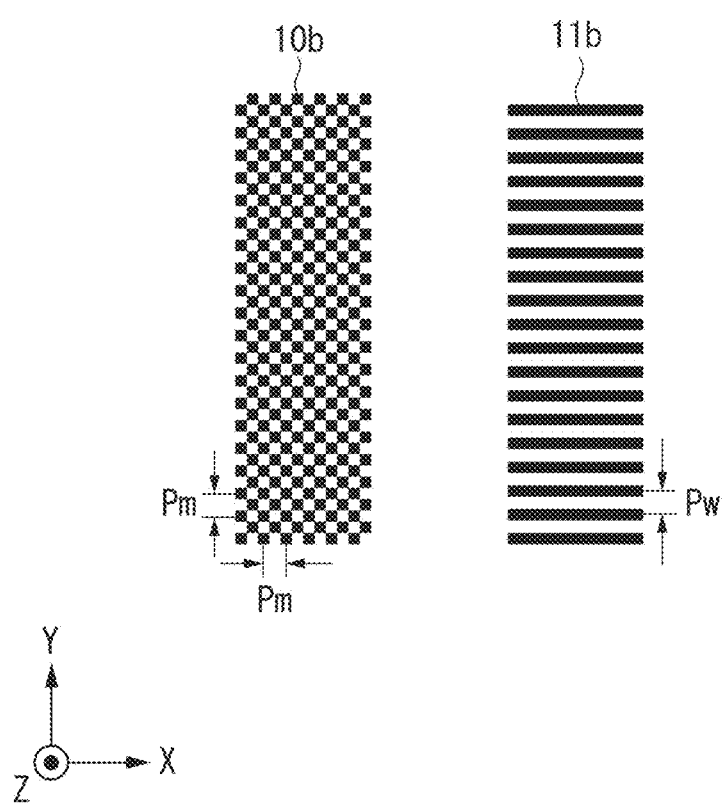

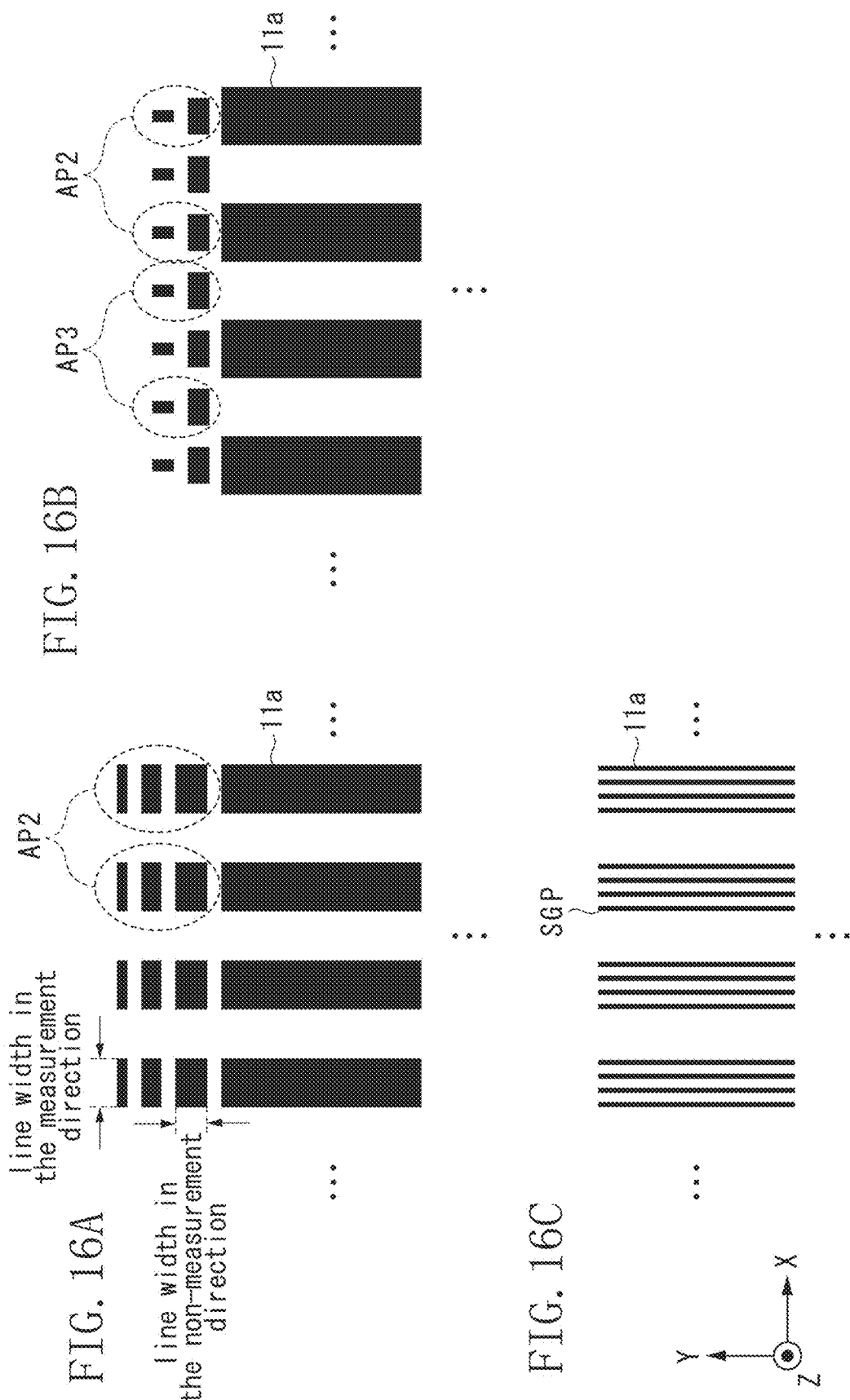

POSITION DETECTOR, POSITION DETECTION METHOD, IMPRINT APPARATUS, AND PRODUCT MANUFACTURING METHOD

BACKGROUND OF THE INVENTION

Field of the Invention

The present invention relates to a position detector, a position detection method, an imprint apparatus, and a product manufacturing method.

Description of Related Art

An imprint technique is a technique for forming a pattern on an imprint material provided on a substrate, by using a mold. The imprint technique is proposed as one of lithography techniques for mass production of semiconductor devices and magnetic storage media. The imprint apparatus forms a pattern onto an imprint material supplied on a substrate, by using a mold. The imprint apparatus forms a pattern of an imprint material on a substrate by curing the imprint material in a state where the mold is brought into contact with the imprint material and then by detaching the mold from the cured imprint material.

In the imprint apparatus, when bringing the mold into contact with the imprint material, it is necessary to accurately perform the alignment between the mold and the substrate. For example, the die-by-die alignment method is employed as an alignment method for the imprint apparatus. In the die-by-die alignment method, alignment is performed by detecting marks formed in shot areas on a substrate and marks formed on a mold. A technique for performing the alignment between a mold and a substrate has been conventionally discussed in Japanese Patent Application Laid-Open No. 2013-030757.

Japanese Patent Application Laid-Open No. 2013-030757 discusses an imprint apparatus having a mark detector for detecting marks used for the alignment between a mold and a substrate. In the imprint apparatus discussed in Japanese Patent Application Laid-Open No. 2013-030757, diffraction gratings are formed on each of the mold and the substrate as marks used for the alignment between the mold and the substrate. The diffraction gratings to be formed on the mold and the substrate have marks with a period in a direction (measurement direction) of obtaining the relative position between the mold and the substrate. Further, at least one of the diffraction gratings formed on the mold and the substrate has marks with a period in a direction (non-measurement direction) intersecting with the measurement direction. A checkerboard-like diffraction grating is one example of a diffraction grating having marks with a period in a measurement direction and marks with a period in a non-measurement direction.

A position detector detects a moire occurring in the diffraction grating on the substrate side and the diffraction grating on the mold side. The position detector includes an illumination optical system for illuminating the diffraction gratings, and a detection optical system for detecting diffracted light (such as a moire pattern) from the diffraction gratings. Japanese Patent Application Laid-Open No. 2013-030757 discusses a technique for forming a plurality of poles on the pupil plane of the illumination optical system, and forming diffraction gratings corresponding to a plurality of measurement directions to measure the relative position between the mold and the substrate in a plurality of directions.

However, in the conventional technique, diffracted light and scattered light (both unnecessary light) unrelated to mark detection occur from edges of the diffraction grating on the mold side and the diffraction grating on the substrate side in the non-measurement direction. Therefore, if unnecessary light enters a detection signal detected by the position detector, an error arises in mark detection. As a result, the alignment accuracy (overlay accuracy) between the mold and the substrate is negatively affected.

SUMMARY OF THE INVENTION

According to an aspect of the present invention, a position detector includes a detection unit configured to detect light from a first diffraction grating including a first pattern disposed in a first direction, and light from a second diffraction grating including a second pattern disposed in the first direction, and a control unit configured to obtain a relative position between the first and the second diffraction gratings based on the light detected by the detection unit. A third pattern is formed in a second direction different from the first direction at edges of the first pattern of the first diffraction grating, the third pattern has a width smaller than a width of the first pattern of the first diffraction grating in the first direction.

Further features of the present invention will become apparent from the following description of exemplary embodiments with reference to the attached drawings.

BRIEF DESCRIPTION OF THE DRAWINGS

FIGS. 7A and 7B illustrate alignment marks in the X-axis direction according to the first exemplary embodiment.

FIGS. 8A and 8B illustrate alignment marks in the Y-axis direction according to the first exemplary embodiment.

FIGS. 16A, 16B, and 16C illustrate patterns disposed at edges of diffraction gratings according to sixth to eighth examples, respectively.

DESCRIPTION OF THE EMBODIMENTS

Figure 1:
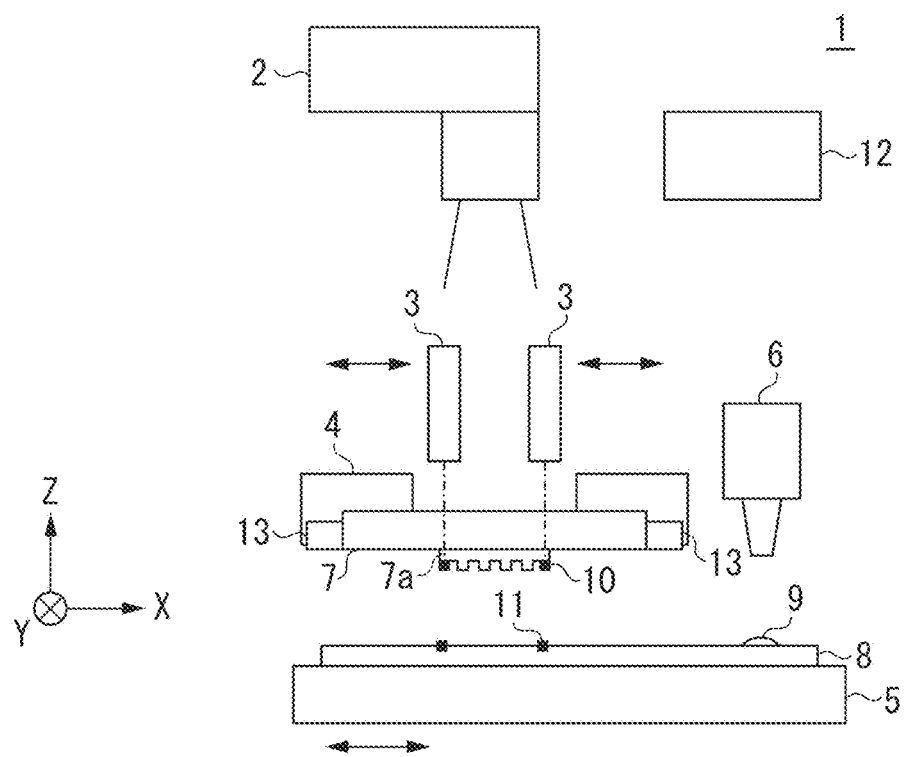
FIG. 1 illustrates a configuration of an imprint apparatus according to a first exemplary embodiment.

Exemplary embodiments of the present invention will be described below with reference to the accompanying drawings. In the following drawings, identical members are assigned the same reference numeral, and redundant descriptions thereof will be omitted.
(Imprint Apparatus)

A first exemplary embodiment will be described below. An imprint apparatus according to the present invention will be described below with reference to FIG. 1. FIG. 1 is a schematic view illustrating a configuration of an imprint apparatus 1 according to an aspect of the present invention. The imprint apparatus 1 brings a mold 7 into contact with an imprint material 9 supplied on a substrate 8 and applies a curing energy to the imprint material 9 to form a cured material pattern onto which a relief pattern of the mold is transferred. For example, the imprint apparatus 1 is used for manufacturing devices such as semiconductor devices. The accompanying drawings will be described on the premise that the X- and Y-axes perpendicularly intersect with each other in a plane parallel to the substrate 8 and the mold 7, and the Z-axis perpendicularly intersects with the X- and Y-axes, as illustrated in FIG. 1. The imprint apparatus 1 forms a pattern on the substrate 8 by using the mold 7 on which a relief pattern 7a is formed. The imprint apparatus 1 cures the imprint material 9 in a state where the mold 7 is in contact with the imprint material 9 supplied on the substrate 8. When the imprint apparatus 1 detaches the mold 7 from the cured imprint material 9, a pattern of the imprint material 9 is formed on the substrate 8.

A curable composite (also referred to as a resin in an uncured state) to be cured when a curing energy is applied is used as the imprint material 9. Electromagnetic waves and heat are used as a curing energy. Electromagnetic waves include infrared light, visible light, and ultraviolet light having a wavelength, for example, selected from a range from 10 nm to 1 mm inclusive. A curable composite is a composite to be cured when irradiated with light or heated. A photocurable composite to be cured by light may contain at least a polymerizable compound and a photopolymerization initiator and may contain a non-polymarizable compound or a solvent as required. A non-polymarizable compound is the compound of at least one type selected from groups including sensitizers, hydrogen donors, internal mold release agents, interfacial active agents, antioxidants, and polymer components.

The imprint apparatus 1 includes a light irradiation unit 2, a position detector 3, a mold holding unit 4, a substrate stage 5, a dispenser 6, and a control unit 12. The imprint apparatus 1 according to the present invention employs the photocuring method for curing an imprint material on a substrate by irradiating the imprint material 9 with light such as ultraviolet light.

The light irradiation unit 2 is an irradiation apparatus for irradiating the imprint material 9 with light. The light irradiation unit 2 includes a light source (not illustrated). As a light source, for example, a high-pressure mercury lamp, various types of excimer lamps, excimer laser, or a light emitting diode (LED) can be used. The light irradiation unit 2 may include a plurality of optical elements for uniformly irradiating the imprint material 9 on the substrate 8 with light emitted from a light source in a predetermined shape. It is desirable that an irradiation area (irradiation range) of the light emitted from the light irradiation unit 2 on the substrate 8 is almost the same as or slightly larger than the area where the pattern 7a of the mold 7 is formed. If the irradiation area is minimized, the possibility is reduced that the mold 7 or the substrate 8 expands because of the heat accompanying the emission of light, and that a displacement or distortion occurs in the pattern formed on the imprint material 9. The minimizing of the irradiation area also enables reducing the possibility that the light reflected by the substrate 8 reaches the dispenser 6 (feed mechanism) for coating (supplying) the imprint material 9, and that the imprint material 9 remaining at the discharge port of the dispenser 6 is cured.

The detection unit 3 detects marks for the relative alignment between the mold 7 and the substrate 8. More specifically, the detection unit 3 can obtain the relative position between the mold 7 and the substrate 8 by detecting a mold side mark 10 formed on the mold 7 and a substrate side mark 11 formed on the substrate 8. As described below, the detection unit 3 can also obtain the relative position between the mold 7 and the substrate 8 by detecting a moire caused by diffracted light from the mold side mark 10 and the substrate side mark 11. The optical axis of the detection unit 3 is disposed so as to become perpendicular to the mold 7 or the substrate 8. The detection unit 3 may include a moving mechanism. In this case, the detection unit 3 is movable along (parallel to) the surfaces of the mold 7 and the substrate 8 according to the positions of the mold side mark 10 and the substrate side mark 11. The detection unit 3 may further move in the Z-axis direction perpendicular to the surfaces of the mold 7 and the substrate 8 to align the focus of the optical system of the detection unit 3 with mark positions. The control unit 12 of the imprint apparatus 1 controls the mold holding unit 4, the substrate stage 5, and a shape correction mechanism (described below) based on the relative position between the mold 7 and the substrate 8. The control unit 12 may be included in the imprint apparatus 1, or installed on a different location from the imprint apparatus 1 and remotely controlled.

The mold holding unit 4 (mold retaining unit) includes a mold chuck mechanism for holding the mold 7 by vacuum suction force or electrostatic force. The mold holding unit 4 holds the mold 7 so that the surface with the pattern 7a formed thereon faces the substrate 8. Since the light irradiation unit 2 irradiates the imprint material 9 with light (curing light) via the mold 7, the mold 7 is made of a light transmissive material (for example, fused silica). The mold holding unit 4 includes a mold moving mechanism (not illustrated) for moving the mold 7 to bring the mold 7 into contact with the imprint material 9 on the substrate 8. The mold moving mechanism can move the mold 7 in the Z-axis direction to bring the mold 7 close to or away from the substrate 8. The mold holding unit 4 further includes a shape correction mechanism 13 for changing the shape of the mold 7. A certain shape correction mechanism 13 changes the shape of the mold 7, for example, by applying a force to a side surface of the mold 7.

The substrate stage 5 (substrate holding unit) includes a substrate chuck mechanism for holding the substrate 8 by vacuum suction force or electrostatic force, and a substrate moving mechanism (not illustrated) for moving the substrate 8 in the direction on the XY plane. Although, in the imprint apparatus 1, the mold holding unit 4 (mold 7) may be moved in the Z-axis direction to bring the mold 7 into contact with the imprint material 9 (mold contact) or detach the mold 7 therefrom (mold separation), the substrate stage 5 (substrate 8) may be moved in the Z-axis direction. Alternatively, both the mold holding unit 4 and the substrate stage 5 may be movable. The substrate 8 is made of glass, ceramics, metal, semiconductor, or resin. As required, a member made of a material different from the substrate 8 may be formed on the surface of the substrate 8. More specifically, the substrate 8 is made of a silicon wafer, compound semiconductor wafer, or fused silica.

The dispenser 6 is a feeding apparatus for supplying the imprint material 9 to the substrate 8. The dispenser 6 is provided with a discharge port (nozzle) for supplying the imprint material 9. The imprint material 9 is supplied onto the substrate 8 in the form of a film by a spin coater or slit coater. Alternatively, the imprint material 9 may be supplied onto the substrate 8 in the form of droplets, in the form of an island formed by a series of a plurality of droplets, or in the form of a film by a liquid jet head. The viscosity (at 25 degrees) of the imprint material 9 is, for example, 1 mPa-s or above and 100 mPa-s or below. Therefore, the imprint apparatus 1 may not include the dispenser 6. For example, a dispenser may be provided outside the imprint apparatus 1, and the substrate 8 with the imprint material 9 pre-supplied thereon by the dispenser may be carried into the imprint apparatus 1.

(Imprint Method)

Figure 2A:
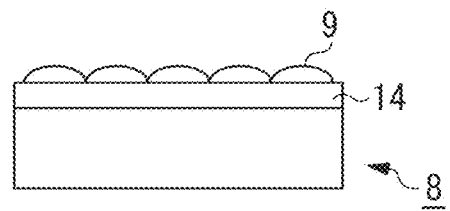
FIG. 2A to 2F illustrate an imprint method and a method for processing a workpiece according to the first exemplary embodiment.

An imprint method by the imprint apparatus 1 will be described below. A substrate conveyance unit (not illustrated) conveys the substrate 8 to the imprint apparatus 1, and mounts the substrate 8 on the substrate stage 5. The substrate 8 held on the substrate stage 5 is moved to the application position to coat the surface of the substrate 8 with the imprint material 9 by using the dispenser 6. Then, the dispenser 6 supplies the imprint material 9 to the predetermined shot area (imprint area) on the substrate 8 (coating process). For example, as illustrated in FIG. 2A, the substrate 8 such as a silicon wafer with a workpiece 14, such as an insulator, formed on the surface is prepared. Then, the imprint material 9 is supplied onto the surface of the workpiece 14 by using the ink-jet method. FIG. 2A illustrates a state where the imprint material 9 in the form of a plurality of droplets is supplied onto the surface of the substrate 8.

Figure 2B:
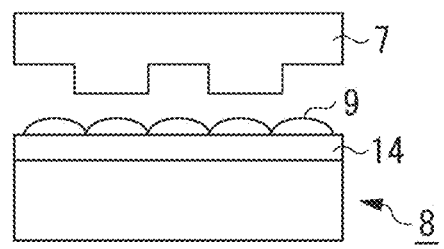

Then, the shot area supplied with the imprint material 9 is moved directly under the mold 7 (pattern 7a). As illustrated in FIG. 2B, the mold 7 for imprint is disposed above the imprint material 9 on the substrate 8 so that the side with the relief pattern formed thereon faces the imprint material 9.

Figure 2C:
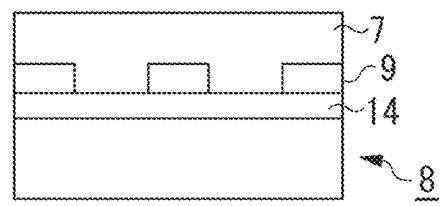

Then, the mold 7 is brought into contact with the imprint material 9 supplied on the substrate 8 (mold contact process). In this case, concave portions of the pattern 7a are filled with the imprint material 9. In this state, the detection unit 3 detects the mold side mark 10 and the substrate side mark 11. The imprint apparatus 1 performs the alignment between the mold 7 and the substrate 8, and the shape correction on the mold 7 using the shape correction mechanism 13, based on a detection result of the detection unit 3. When the filling of the imprint material 9 into the pattern 7a, the alignment between the mold 7 and the substrate 8, and the shape correction on the mold 7 have been performed in a sufficiently way, the light irradiation unit 2 irradiates the imprint material 9 with light to cure it (curing process). For example, as illustrated in FIG. 2C, the imprint apparatus 1 presses the mold 7 onto the substrate 8 with the imprint material 9 supplied thereon. The gap between the mold 7 and the workpiece 14 is filled with the imprint material 9. When the imprint material 9 is irradiated with light as a curing energy in this state, the imprint material 9 is cured (curing process).

Figure 2D:
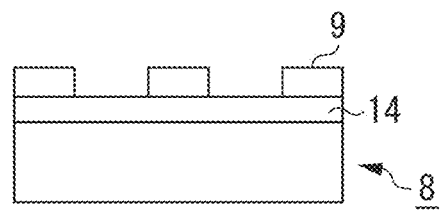

After curing the imprint material 9, when the imprint apparatus 1 releases the mold 7 from the cured imprint material 9, a pattern of the imprint material 9 is formed on the substrate 8 (mold separation process). As illustrated in FIG. 2D, when the mold 7 is released from the substrate 8 after curing the imprint material 9, a cured material pattern of the imprint material 9 is formed on the substrate 8. The cured material pattern is formed such that concave portions of the mold 7 correspond to convex portions of the cured material, and convex portions of the mold 7 correspond to concave portions of the cured material. In such a way, the relief pattern of the mold 7 has been transferred onto the imprint material 9.

By repeating the processes illustrated in FIGS. 2A to 2D for each shot area, a pattern of the imprint material 9 can be formed on a plurality of the shot areas on the substrate 8.

Figure 2E:
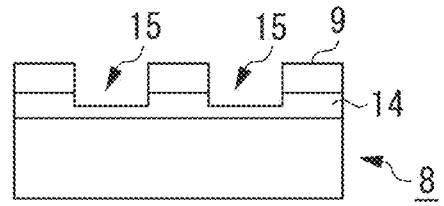
Figure 2F:
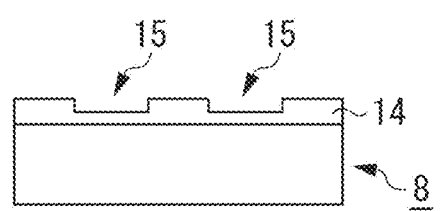

Further, an example of a method for processing the workpiece 14 by using a pattern of the imprint material 9 will be described below. As illustrated in FIG. 2E, when the cured material pattern of the imprint material 9 is etched as an etching resistant mask, portions where the cured material is missing or thinly remains are removed from the surface of the workpiece 14, and grooves 15 are formed. As illustrated in FIG. 2F, when the cured material pattern of the imprint material 9 is removed, the grooves 15 are formed on the surface of the workpiece 14, thus obtaining a product. In this example, the cured material pattern of the imprint material 9 is removed. However, instead of removal of the pattern after processing, the pattern may be used, for example, as a film for insulation between layers contained in a semiconductor device, i.e., a component member of a product.

(Alignment Method)

A method for detecting the mold side mark 10 formed on the mold 7 and the substrate side mark 11 formed on the substrate 8 to perform the alignment between the mold 7 and the substrate 8 will be described below.

Figure 3:
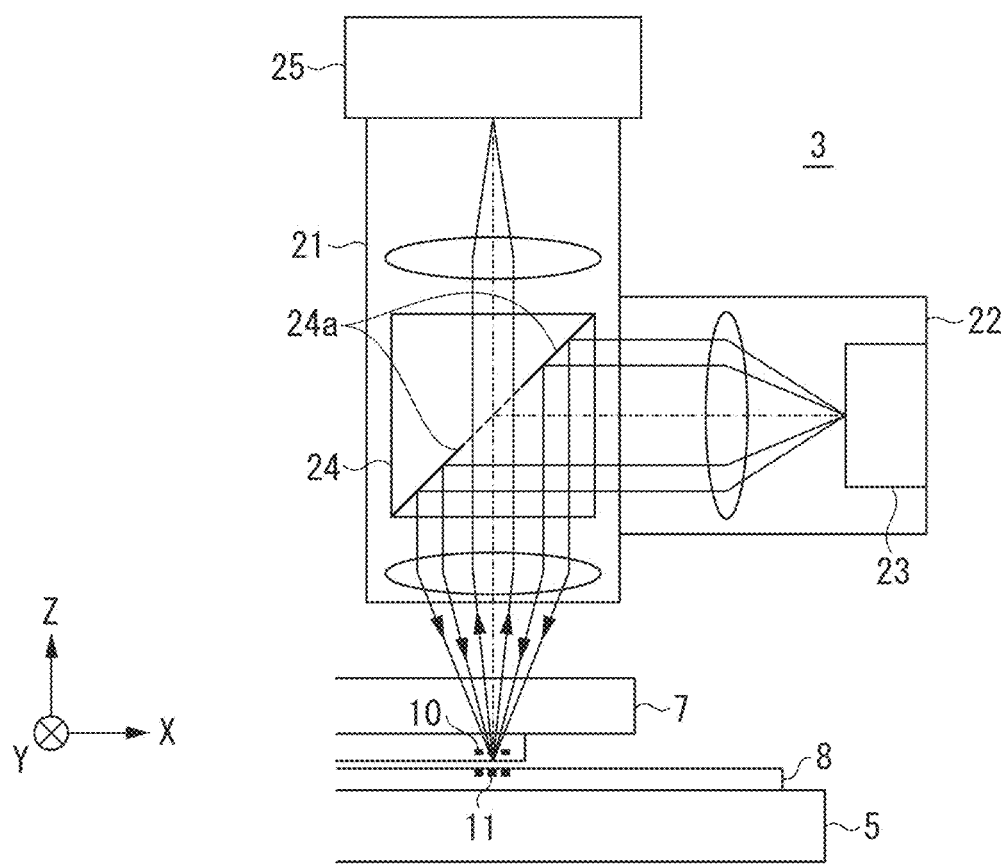
FIG. 3 illustrates a configuration of a detection unit according to the first exemplary embodiment.

FIG. 3 is a schematic view illustrating an example of a configuration of the detection unit 3 according to the present exemplary embodiment. The detection unit 3 includes a detection optical system 21 and an illumination optical system 22. The illumination optical system 22 guides the light from a light source 23 to the same optical path as that of the detection optical system 21 by using optical members such as a prism 24 to illuminate the mold side mark 10 and the substrate side mark 11. For example, a halogen lamp or LED is used as the light source 23. The wavelength of the light emitted from the light source 23 is preferably different from the wavelength of the light emitted from the light irradiation unit 2. For example, ultraviolet light is used as the light emitted from the light irradiation unit 2, and visible light or infrared light is used as the light emitted from the light source 23.

The detection optical system 21 and the illumination optical system 22 are configured to share some optical elements configuring the two systems. The prism 24 is disposed on or near the pupil planes of the detection optical system 21 and the illumination optical system 22. The mold side mark 10 and the substrate side mark 11 are composed of diffraction gratings. A pattern (moire) caused by diffracted light from the mold side mark 10 and the substrate side mark 11 illuminated by the illumination optical system 22 is detected by an image sensor 25. The detection optical system 21 guides the light from the mold side mark 10 and the substrate side mark 11 to the image sensor 25. For example, a charge coupled device (CCD) sensor or complementary metal-oxide semiconductor (CMOS) sensor is used as the image sensor 25.

The prism 24 has a bonding surface composed of a reflective film 24a for reflecting the light of the peripheral portion of the pupil plane of the illumination optical system 22. The reflective film 24a serves as an aperture for defining the profile of the pupil intensity distribution of the illumination optical system 22. The reflective film 24a also serves as an aperture for defining the size of the pupil of the detection optical system 21. Alternatively, the reflective film 24a defines a detection numerical aperture NA (NAo). The prism 24 may be a half mirror prism having a semi-transparent film on the bonding surface. However, instead of a prism, the prism 24 may be a plate-like optical element having a reflective film formed on the surface. To change the shape of the pupil of the illumination optical system 22 or the detection optical system 21, the prism 24 may be changeable with another prism having another aperture shape/size by a switching mechanism such as a turret or sliding mechanism (not illustrated). The position where the prism 24 is disposed may not necessarily be on or near the pupil planes of the detection optical system 21 and the illumination optical system 22.

Figure 4:
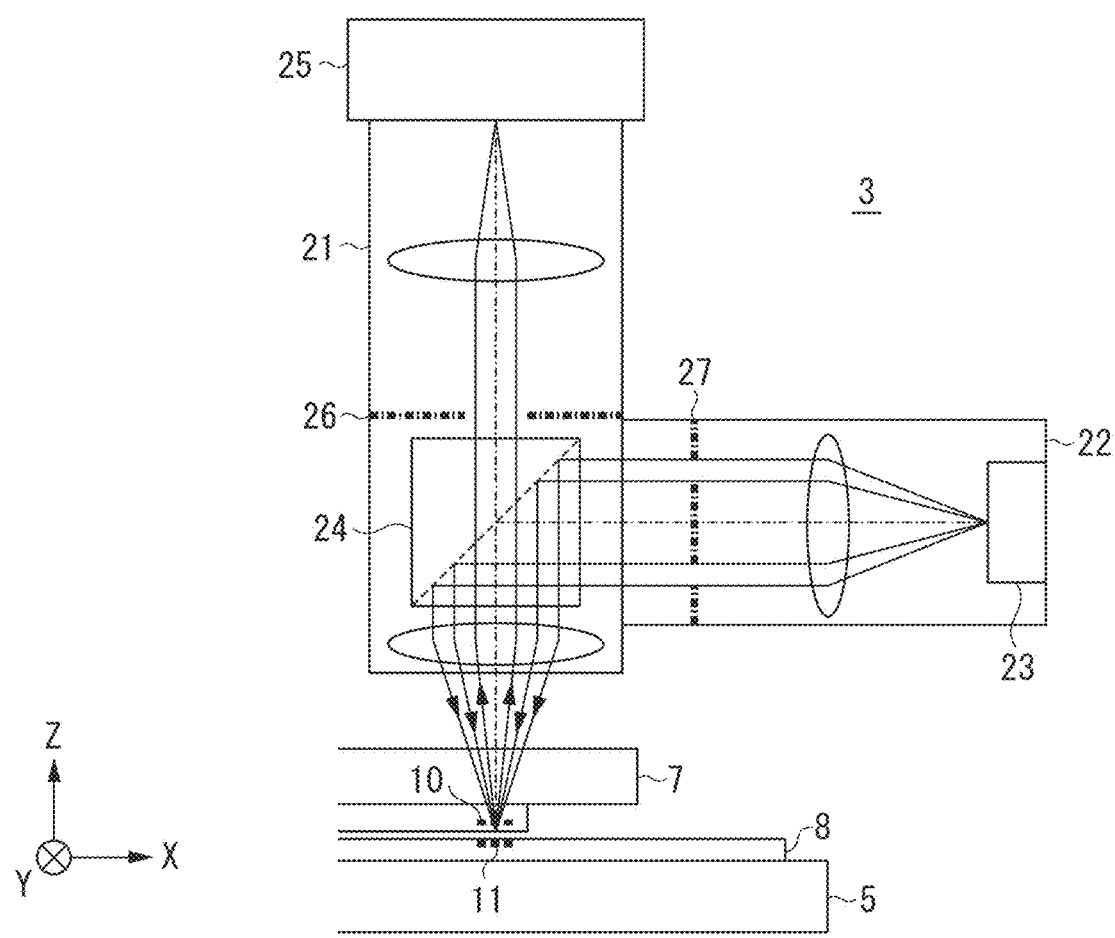
FIG. 4 illustrates another configuration of the detection unit according to the first exemplary embodiment.

The aperture for defining the shape of the pupil intensity distribution may not necessarily be disposed on the prism 24. For example, as illustrated in FIG. 4, an aperture 26 is disposed on the pupil plane of the detection optical system 21, and an aperture 27 is disposed on the pupil plane of the illumination optical system 22. The aperture 26 defines the size of the pupil plane of the detection optical system 21, and the aperture 27 defines the pupil intensity distribution of the illumination optical system 22. In this case, a half prism having a semi-transparent film on the bonding surface is used as the prism 24. Further, the aperture 26 and the aperture 27 may be adjustable to adjust an aperture cross-section thereof, or may be changeable with an aperture having a different aperture shape/size by a switching mechanism such as a turret (not illustrated).

Figure 5:
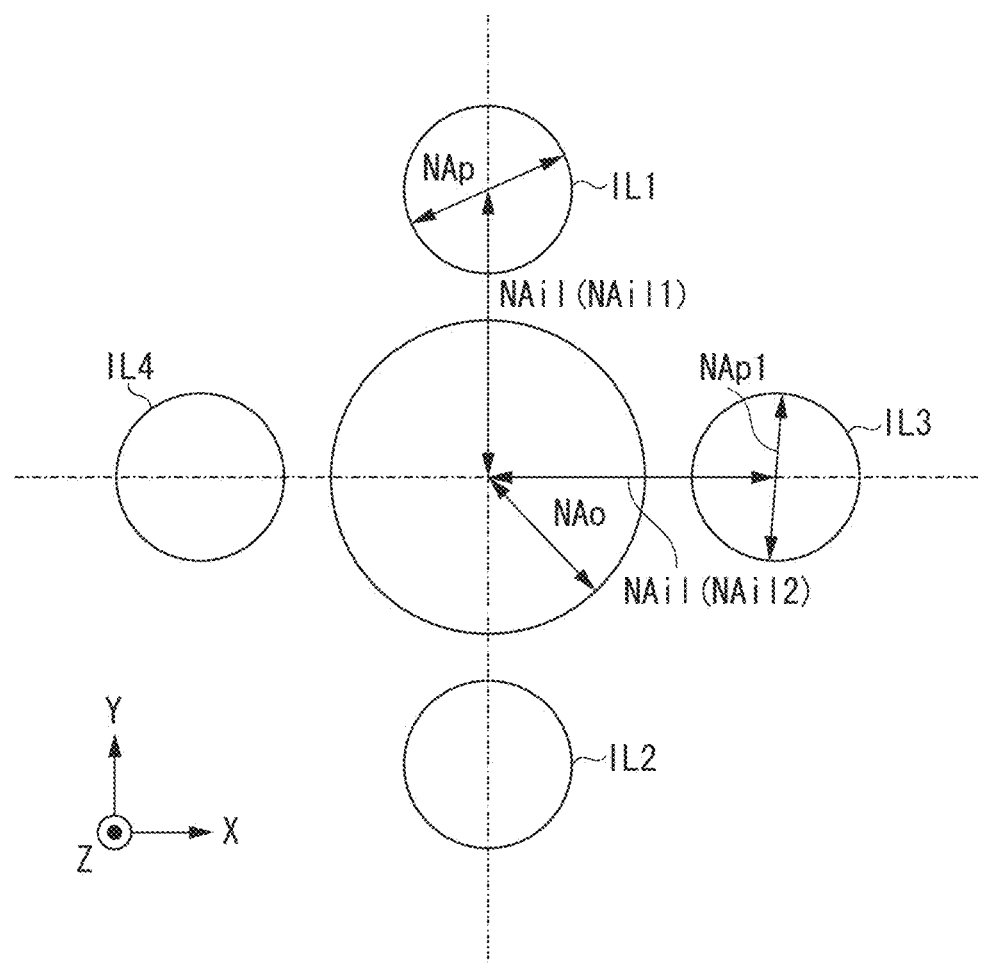
FIG. 5 illustrates illumination light distributions on the pupil plane of the detection unit according to the first exemplary embodiment.

FIG. 5 illustrates a relation between the distribution of the illumination light and the Numerical Aperture (NA) of the detection optical system 21 on the pupil plane of the detection unit 3. Referring to FIG. 5, the size of the pupil plane is represented by the NA. The illumination light distributions on the pupil plane of the illumination optical system 22 according to the present exemplary embodiment include four different illumination light distributions IL1, IL2, IL3 to IL4. Disposing the aperture 27 on the pupil plane of the illumination optical system 22 as shown and described with reference to FIG. 4 above enables forming a plurality of illumination light distributions based on one light source 23. Each of the illumination light distributions IL1 to IL4 has a circular shape with a diameter of NAp. The intersection of the X- and Y-axes is assumed to be optical axis of the detection optical system 21 and the illumination optical system 22.

The illumination light distributions IL1 and IL2 are disposed on the pupil plane of the illumination optical system 22, at positions separated by NAil (NAil1) from the optical axis in the positive and negative directions on the Y-axis, respectively. Thus, the illumination light distributions IL1 and IL2 can be symmetrically disposed to the optical axis on the axis parallel to the Y-axis direction except for the optical axis. The size of the illumination light distributions IL1 and IL2 is NAp (NAp1).

The illumination light distributions IL3 and IL4 are disposed on the pupil plane of the illumination optical system 22, at positions separated by NAil (NAil2) from the optical axis in the positive and negative directions on the X-axis, respectively. Thus, the illumination light distributions IL3 and IL4 can be disposed symmetrically to the optical axis on the axis parallel to the X-axis direction except for the optical axis. The size of the illumination light distributions IL3 and IL4 is NAp (NAp2).

In this way, the illumination light distributions IL1 to IL4 are formed on the illumination optical system 22 so that oblique illumination is performed on the mold side mark 10 and the substrate side mark 11. In this case, the angle of incidence 9 to the mold side mark 10 and the substrate side mark 11 is represented by:

$$\Theta = \sin^{-1}(NAil) \qquad \text{Formula 1}$$

where NAo, NAp, and NAil satisfy the following formula 2.

$$NAo < NAil - NAp/2 \qquad \text{Formula 2}$$

More specifically, when formulas (1) and (2) are satisfied, regular reflection light (zero-order diffracted light) from the mold side mark 10 and the substrate side mark 11 is not detected (dark field illumination).

The principle on which a pattern (moire) is generated by diffracted light from the mold side mark 10 and the substrate side mark 11, and relative position detection using a moire will be described below with reference to FIGS. 6A to 6D. The pattern (first pattern) of the diffraction grating 31 (FIG. 6A) and the pattern (second pattern) of the diffraction grating 32 (FIG. 6B) are slightly different in period in the measurement direction (X-axis direction in FIGS. 6A to 6D). When the two diffraction gratings 31 and 32 having different pattern periods are overlapped, a pattern as illustrated in FIG. 6C arises. This pattern has a period reflecting the difference in period between the two diffraction gratings 31 and 32 (what is called a moire) because of the diffracted light from the two diffraction gratings 31 and 32. Since the phase of a moire varies according to the relative position between the two diffraction gratings 31 and 32, the alignment between the substrate 8 and the mold 7 can be performed by detecting a moire via the detection unit 3. The period of a diffraction grating refers to a period between patterns disposed in the measurement direction.

In a moire, bright and dark positions (moire pattern phase) varies according to the relative position between the two diffraction gratings 31 and 32. For example, when either one of diffraction gratings is shifted in the X-axis direction, the moire illustrated in FIG. 6C changes to the moire illustrated in FIG. 6D. In this case, since the phase of a moire varies with a period larger than the actual shift amount between the two diffraction gratings 31 and 32, the relative position between the two objects can be measured with sufficient accuracy even when the detection optical system 21 shows a low resolution.

Figure 6A:
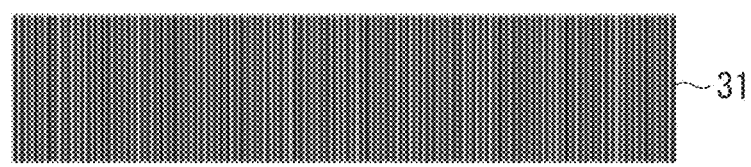
FIGS. 6A to 6D illustrate alignment marks with which a moire occurs.
Figure 6B:
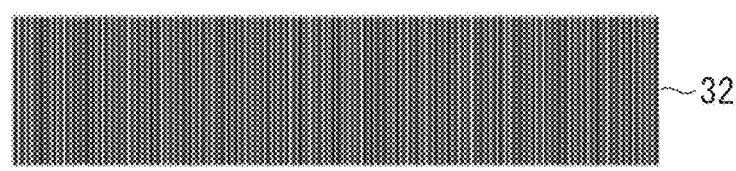
Figure 6C:
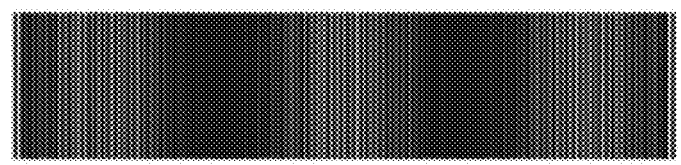
Figure 6D:
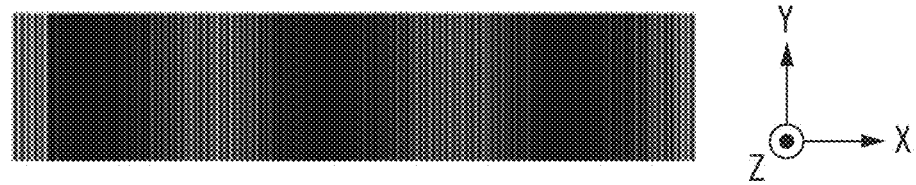

When the diffraction gratings illustrated in FIGS. 6A and 6B is detected in a bright field configuration (when diffracted light is detected from the vertical direction by illuminating the diffraction gratings from the vertical direction) to detect a moire, the zero-order light from the diffraction gratings will also be detected. Since the zero-order light is a factor that contributes to lowering the contrast of a moire, the detection unit 3 according to the present exemplary embodiment has a dark field configuration in which the zero-order light is not detected as described above. Accordingly, to enable moire detection even in a dark field configuration for obliquely illuminating, a periodic structure is provided in either one of the diffraction gratings of the mold side mark 10 and the substrate side mark 11 in the non-measurement direction (Y-axis direction) which intersects with the measurement direction (X-axis direction). For example, a checkerboard-like diffraction grating 10a as illustrated in FIG. 7A is used. Although a checkerboard-like diffraction grating can be used in either diffraction gratings of the mold side mark 10 or the substrate side mark 11, in the present case, a checkerboard-like diffraction grating of the mold side mark 10 will be used below.

FIG. 7A illustrates the diffraction grating 10a of the mold side mark 10 (first mark), and FIG. 7B illustrates a diffraction grating 11a of the substrate side mark 11 (second mark). By detecting the diffracted light from the diffraction gratings 10a and 11a via the detection unit 3, the relative position between the mold 7 and the substrate 8 can be obtained in the X-axis direction. The mold side mark 10 is the checkerboard-like diffraction grating 10a having a cyclic structure with a period Pm in both the X-axis direction (second direction) and the Y-axis direction (first direction). The substrate side mark 11 is the diffraction grating 11a having a periodic structure with a period Pw different from the period Pm in the X-axis direction.

A moire for detecting the relative position in the X-axis direction is generated by illuminating the diffraction gratings 10a and 11a with light emitted from the illumination optical system 22. More specifically, a moire is generated by the illumination light distributions IL1 and IL2 disposed on the pupil plane of the illumination optical system 22 in the Y-axis direction, as illustrated in FIG. 5.

FIG. 8A illustrates a diffraction grating 10b of the mold side mark 10 (third mark), and FIG. 8B illustrates a diffraction grating 11b of the substrate side mark 11 (fourth mark). By detecting the diffracted light from the diffraction gratings 10b and 11b via the detection unit 3, the relative position between the mold 7 and the substrate 8 can be obtained in the Y-axis direction. The mold side mark 10 is the checkerboard-like diffraction grating 10b having a periodic structure with a period Pm in both the X-axis direction (second direction) and the Y-axis direction (first direction). The substrate side mark 11 is the diffraction grating 11b having a periodic structure with a period Pw which is different from the period Pm, in the Y-axis direction.

A moire for detecting the relative position in the Y-axis direction is generated by illuminating the diffraction gratings 10b and 11b with light emitted from the illumination optical system 22. More specifically, a moire is generated by the illumination light distributions IL3 and IL4 disposed on the pupil plane of the illumination optical system 22 in the X-axis direction, as illustrated in FIG. 5.

The illumination light distributions illustrated in FIG. 5 are effective in a case where a pair of the diffraction gratings 10a and 11a illustrated in FIGS. 7A and 7B, and a pair of the diffraction gratings 10b and 11b illustrated in FIGS. 8A and 8B are disposed within the same field of view of the detection optical system 21, and relative positions in the two directions are detected by using one detection system.

Although, in the above-described example, the measurement and the non-measurement directions are perpendicular to each other, the measurement and the non-measurement directions do not necessarily need to be perpendicular. Therefore, if the measurement and the non-measurement directions cannot be set perpendicular, illumination light distributions according to the angle should be suitably selected. Further, it is not necessary to detect a moire for detecting the relative position in the X-axis direction and a moire for detecting the relative position in the Y-axis direction each disposed with the same field of view, at the same time, instead the two moires may be sequentially detected.

Figure 9:
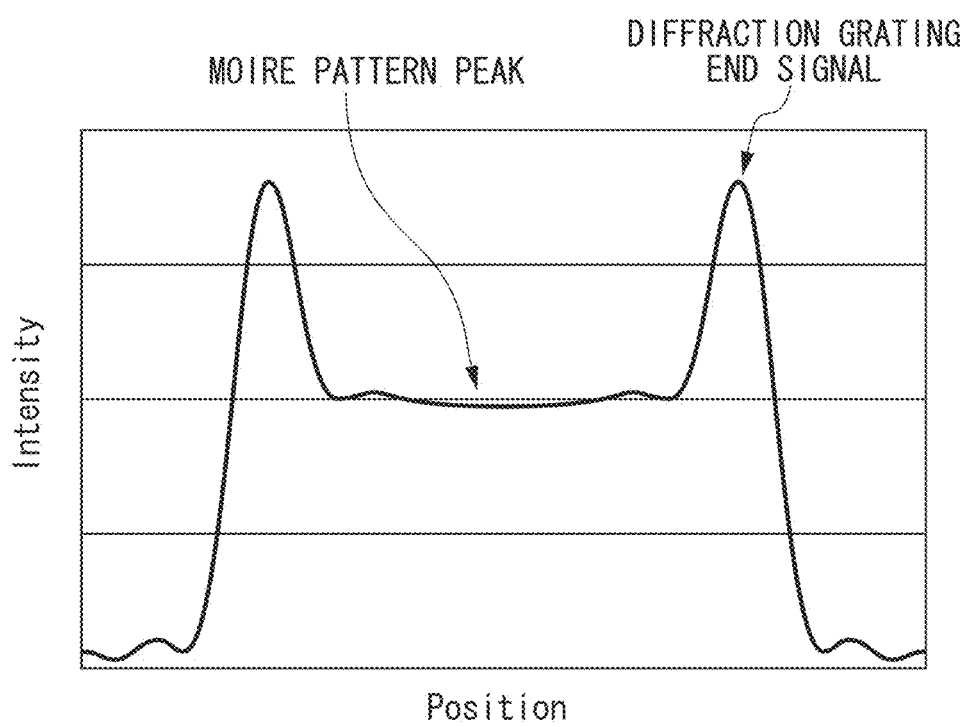
FIG. 9 illustrates a position in diffraction gratings at which a moire occurs in the non-measurement direction and, a quantity of light from the diffraction gratings.

When the above-described diffraction gratings 10a, 11a, 10b, and 11b are illuminated, the illumination light is scattered or diffracted and a large signal (light intensity) occurs at edges of the diffraction gratings 10a, 11a, 10b, and 11b in the non-measurement direction. This large signal is not desirable for measuring the relative position of the alignment marks. FIG. 9 illustrates the magnitude (light intensity) of the signal from the diffraction gratings 10a and 11a in the non-measurement direction obtained through optical simulation when the pair of the diffraction gratings 10a and 11a illustrated in FIGS. 7A and 7B is illuminated. FIG. 9 illustrates a result of integrating the signals from the diffraction gratings in the measurement direction. The horizontal axis is taken to indicate the position in the non-measurement direction, and the vertical axis is taken to indicate the signal intensity (light intensity) from the alignment marks in arbitrary units (au). Referring to FIG. 9, it can be appreciated that a large signal (light intensity) is generated also at the edges of the pattern of a diffraction grating in the non-measurement direction. This signal can be considered to be a signal generated when the pattern of the diffraction grating along the non-measurement direction is interrupted at the edges. Thus, if the signal generated at edges of the diffraction gratings in the non-measurement direction enters a moire, an error may arise in the detection result of the relative position of the diffraction gratings.

Accordingly, in the diffraction gratings according to the present invention, this influence of the signal (light intensity) generated at the edges of the pattern in the non-measurement direction is reduced by specifically devising the shape of the edges of the diffraction gratings in the non-measurement direction which are formed on the mold 7 and the substrate 8.

Figure 10A:
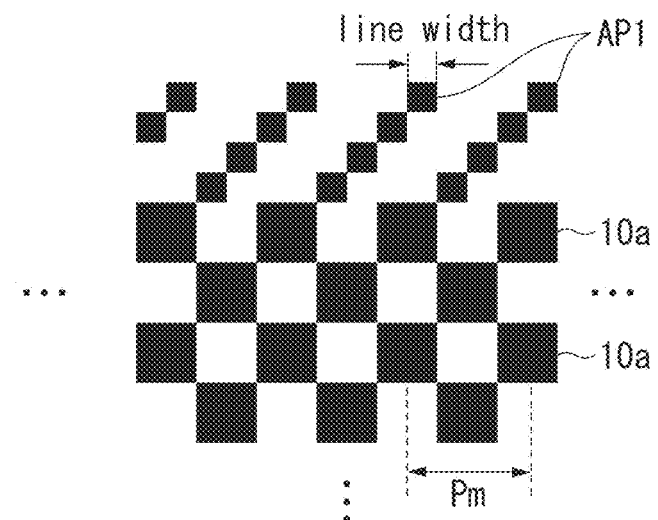
FIGS. 10A and 10B illustrate patterns disposed at edges of diffraction gratings according to a first example.
Figure 10B:
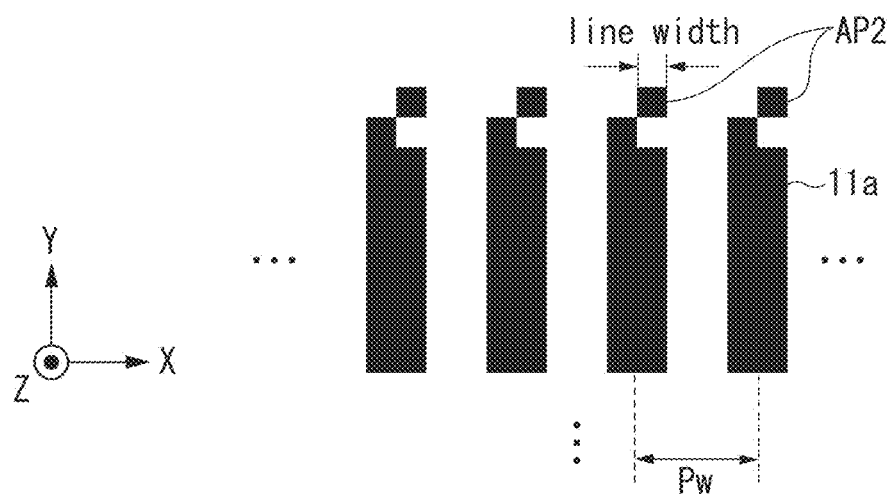

A first example will be described. FIG. 10A illustrates a part of an alignment mark (mold side mark 10) on which a pattern AP1 (third pattern) is formed at an edge of the diffraction grating 10a in the non-measurement direction. FIG. 10B illustrates a part of an alignment mark (substrate side mark 11) on which a pattern AP2 (third pattern) is formed at an edge of the diffraction grating 11a in the non-measurement direction. It is desirable that the line width of the patterns AP1 and AP2 formed on the edges of the alignment marks 10a and 11a is smaller than the period of the diffraction gratings 10a and 11a, and, more preferably, equal to or smaller than a half of the period of the diffraction gratings 10a and 11a or smaller than the resolution of the detection optical system 21. It is also desirable that the line width of each pattern is equal to or smaller than the wavelength of the light used to detect an alignment mark. Referring to FIGS. 10A and 10B, the patterns AP1 and AP2 are disposed on the diffraction gratings 10a and 11a in a direction different from the measurement and the non-measurement directions (X-axis and Y-axis directions). The patterns AP1 and AP2 formed at the edges of the diffraction gratings 10a and 11a differ from the patterns used to obtain the relative position between the mold side mark 10 and the substrate side mark 11.

In the first example, the line width of the pattern AP1 in the measurement and the non-measurement directions is Pm/4, for example, and the line width of the pattern AP2 in the measurement and the non-measurement directions is Pw/4. Although, in the first example, the line width of the pattern AP1 is equal in the measurement and the non-measurement directions, the line width is not limited thereto, and may be different in the measurement and the non-measurement directions. The number and array pitch of the patterns AP1 and AP2 are suitably selected depending on the combination of the diffraction gratings 10a and 11a and the configuration of the detection optical system 21, and are not limited to the specific number or array pitch of patterns. The patterns AP1 and AP2 may be formed in either one of the diffraction gratings 10a and 11a.

Figure 11:
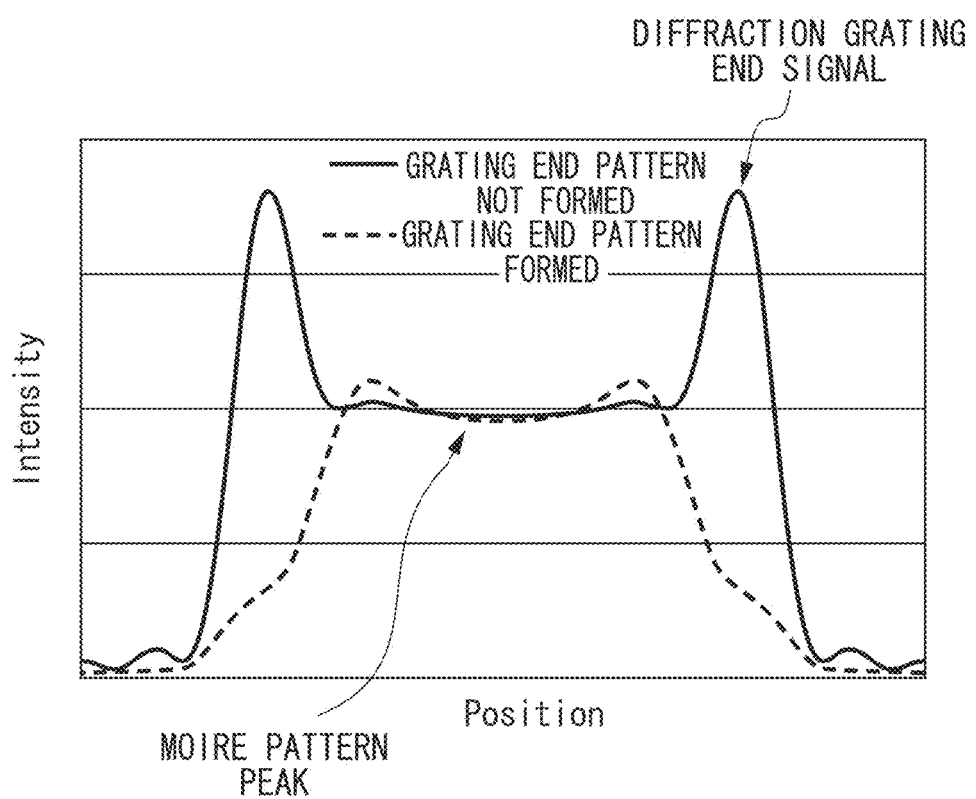
FIG. 11 illustrates a relation between the position on diffraction gratings in the non-measurement direction and the light quantity of light from the diffraction gratings according to the first exemplary embodiment.

FIG. 11 illustrates a result (spectrum intensity) of a moire obtained through optical simulation by using the pair of the diffraction gratings 10a and 11a illustrated in FIGS. 10A and 10B. FIG. 11 illustrates a result of detection of the light from the diffraction gratings 10a and 11a. The horizontal axis is taken to indicate the position in the non-measurement direction, and the vertical axis is taken to indicate the signal intensity (light intensity) from the alignment marks. The dash-dash line in FIG. 11 illustrates that, when the patterns AP1 and AP2 are formed on edges of the diffraction gratings 10a and 11a, the signal (intensity) generated at the edges of the diffraction gratings 10a and 11a in the non-measurement direction is smaller (lower) than that in a case where the patterns AP1 and AP2 are not formed (solid line). Specifically, FIG. 11 illustrates that, when the patterns AP1 and AP2 are formed on the diffraction gratings 10a and 11a, the signal generated at the edges of the diffraction gratings 10a and 11a in the non-measurement direction is substantially the same intensity as the signal generate at the center of the gratings 10a and 11a in the non-measurement direction. As used herein "substantially" refers to a variation in signal intensity level (amplitude) of within +/−3 dB.

This is because the light from the edges of the diffraction gratings 10a and 11a in the non-measurement direction may be scattered or diffracted outside the detection NA (NAo) of the detection optical system 21 by the patterns AP1 and AP2. Since the patterns AP1 and AP2 are disposed in a direction different from the measurement and the non-measurement directions, the light is scattered or diffracted outside the detection NA (NAo). Since the line width of the patterns AP1 and AP2 is smaller than a half of the period of the diffraction gratings 10a and 11a, the change amount of phase is smaller than the edges of the diffraction gratings 10a and 11a in the non-measurement direction in a case where the patterns AP1 and AP2 are not formed. Therefore, the light (diffracted light and scattered light) from the patterns AP1 and AP2 detected by the detection optical system 21 can be decreased (reduced) to a further extent than the light (diffracted light and scattered light) from the edges of the diffraction gratings 10a and 11a in the non-measurement direction in a case where the patterns AP1 and AP2 are not formed.

Figure 12A:
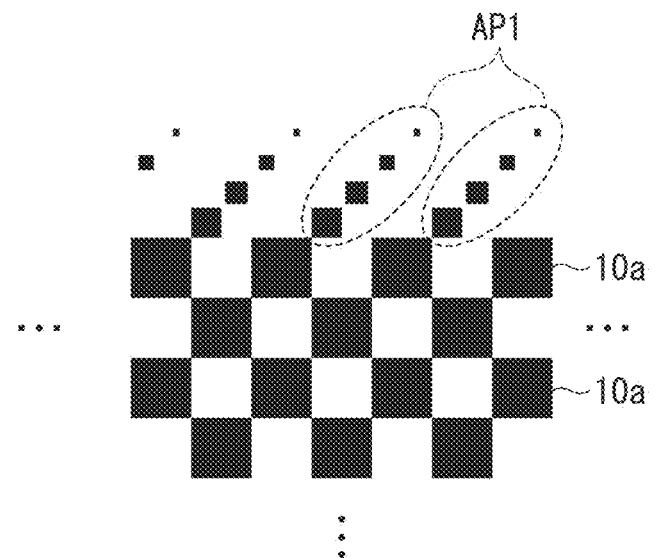
FIGS. 12A and 12B illustrate patterns disposed at edges of diffraction gratings according to a second example.
Figure 12B:
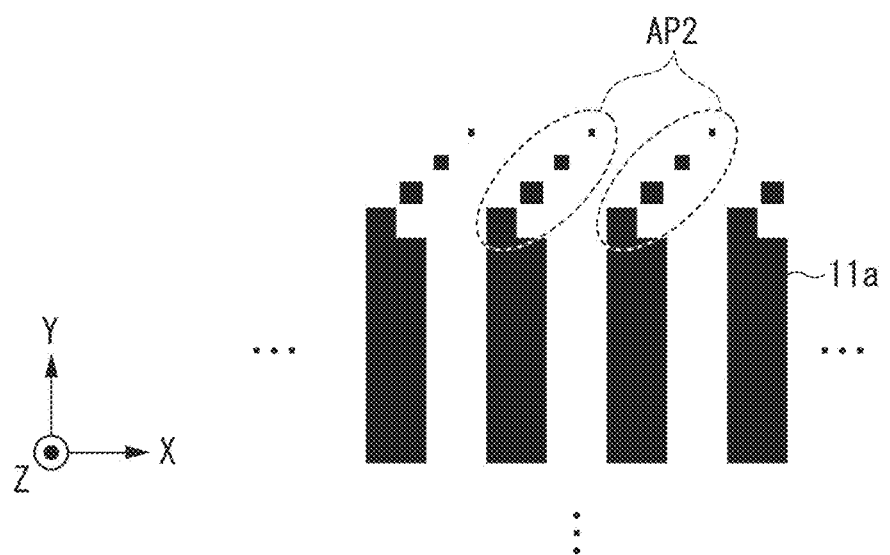

A second example will be described. Patterns AP1 and AP2 formed on the diffraction gratings 10a and 11a according to the second example will be described below. FIG. 12A illustrates a part of an alignment mark (mold side mark 10) on which the pattern AP1 (third pattern) is formed at an edge of the diffraction grating 10a in the non-measurement direction. FIG. 12B illustrates a part of an alignment mark (substrate side mark 11) on which the pattern AP2 (third pattern) is formed at an edge of the diffraction grating 11a in the non-measurement direction. The patterns AP1 and AP2 formed on the alignment marks are disposed in a direction different from the measurement and the non-measurement directions, and the line width gradually decreases with increasing distance from the diffraction gratings 10a and 11a. When the line width of the patterns AP1 and AP2 is gradually decreased to continuously change the density of the patterns AP1 and AP2, the phase of the light from the patterns continuously changes. Therefore, the light (diffracted light and scattered light) from the patterns AP1 and AP2 detected by the detection optical system 21 can be decreased (reduced) to a further extent than the light (diffracted light and scattered light) from the edges of the diffraction gratings 10a and 11a in the non-measurement direction in a case where the patterns AP1 and AP2 are not formed.

Figure 13A:
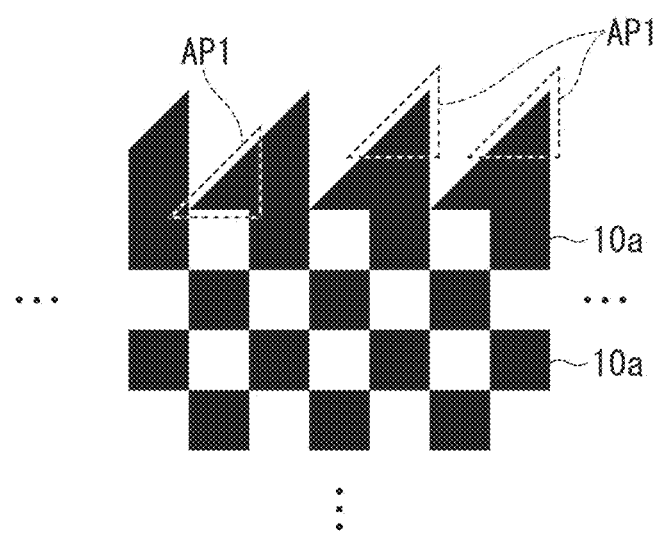
FIGS. 13A and 13B illustrate patterns disposed at edges of diffraction gratings according to a third example.
Figure 13B:
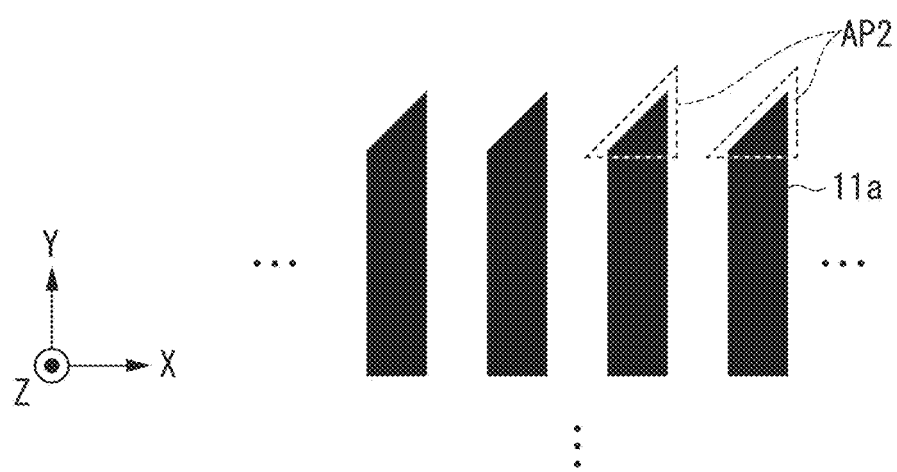

A third example will be described. Patterns AP1 and AP2 formed on the diffraction gratings 10a and 11a according to the third example will be described below. FIG. 13A illustrates a part of an alignment mark (mold side mark 10) on which the pattern AP1 (third pattern) is formed at an edge of the diffraction grating 10a in the non-measurement direction. FIG. 13B illustrates a part of an alignment mark (substrate side mark 11) on which the pattern AP2 (third pattern) is formed at an edge of the diffraction grating 11a in the non-measurement direction. As illustrated in FIGS. 13A and 13B, patterns AP1 and AP2 formed on the edge of alignment marks have a triangular shape, and are formed at the edges of the diffraction gratings 10a and 11a in the non-measurement direction. At least one side of the triangular patterns formed on the alignment marks is oriented in a direction different from the measurement and the non-measurement directions. Therefore, the light (diffracted light and scattered light) from at least one side of the patterns AP1 and AP2 is scattered or diffracted in a direction different from the measurement and the non-measurement directions. Therefore, the light (diffracted light and scattered light) from the patterns AP1 and AP2 detected by the detection optical system 21 can be decreased (reduced) to a further extent than the light (diffracted light and scattered light) from the edges of the diffraction gratings 10a and 11a in the non-measurement direction in a case where the patterns AP1 and AP2 are not formed.

Figure 14A:
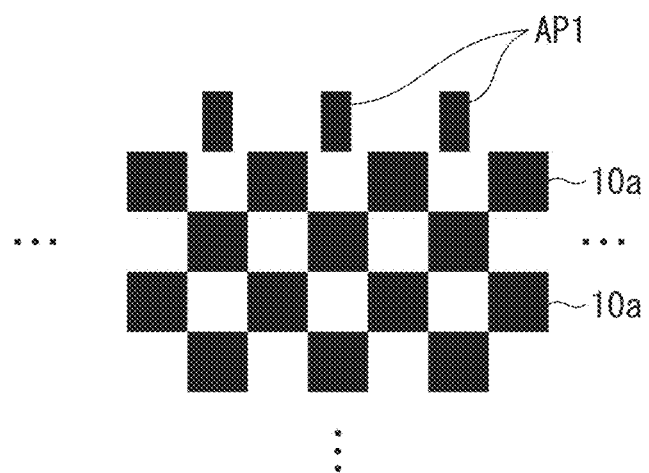
FIGS. 14A and 14B illustrate patterns disposed at edges of diffraction gratings according to a fourth example.
Figure 14B:
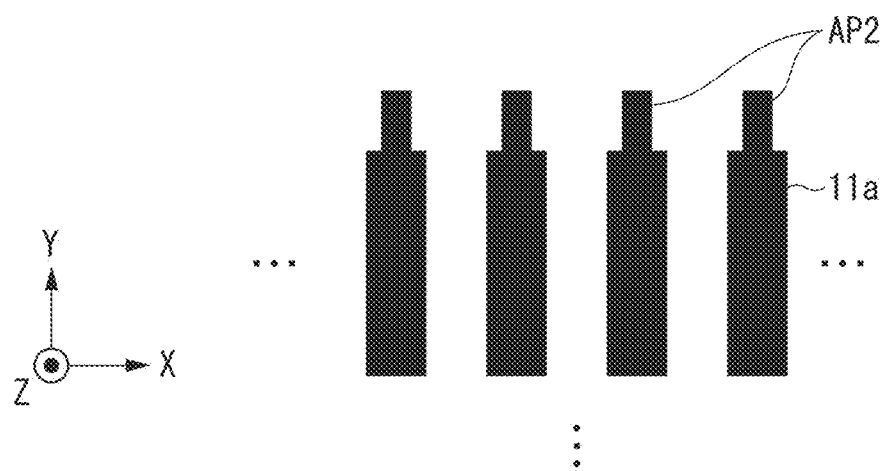

A fourth example will be described. Patterns AP1 and AP2 formed on the diffraction gratings 10a and 11a according to the fourth example will be described below. FIG. 14A illustrates a part of an alignment mark (mold side mark 10) on which the pattern AP1 (third pattern) is formed at an edge of the diffraction grating 10a in the non-measurement direction. FIG. 14B illustrates a part of an alignment mark (substrate side mark 11) on which the pattern AP2 (third pattern) is formed at an edge of the diffraction grating 11a in the non-measurement direction. The patterns AP1 and AP2 formed on the alignment marks are disposed with the same period as the period of the patterns of the diffraction gratings 10a and 11a in the measurement direction, and have a line width smaller than the line width of the patterns of the diffraction gratings 10a and 11a. The line width of the patterns AP1 and AP2 is smaller than the line width of the patterns of the diffraction gratings 10a and 11a. More specifically, when the pattern density is changed in the non-measurement direction, a phase is changed in the non-measurement direction. Therefore, the light (diffracted light and scattered light) from the patterns AP1 and AP2 can be decreased (reduced) to a further extent than the light (diffracted light and scattered light) from the edges of the diffraction gratings 10a and 11a in the non-measurement direction.

Figure 15A:
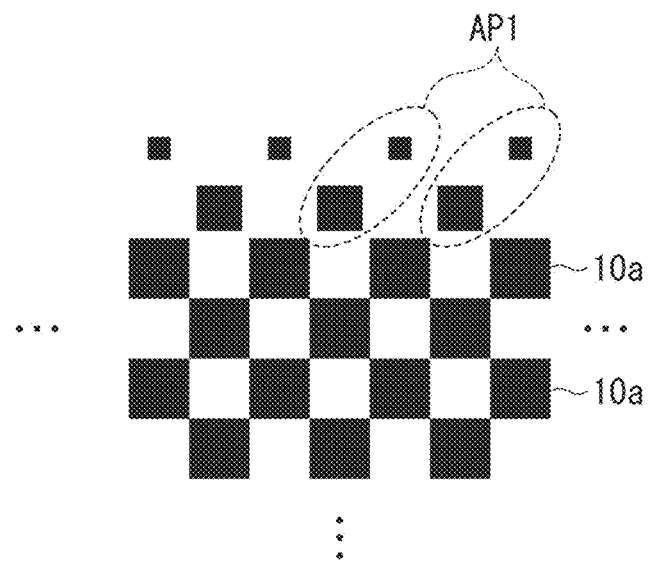
FIGS. 15A and 15B illustrate patterns disposed at edges of diffraction gratings according to a fifth example.
Figure 15B:
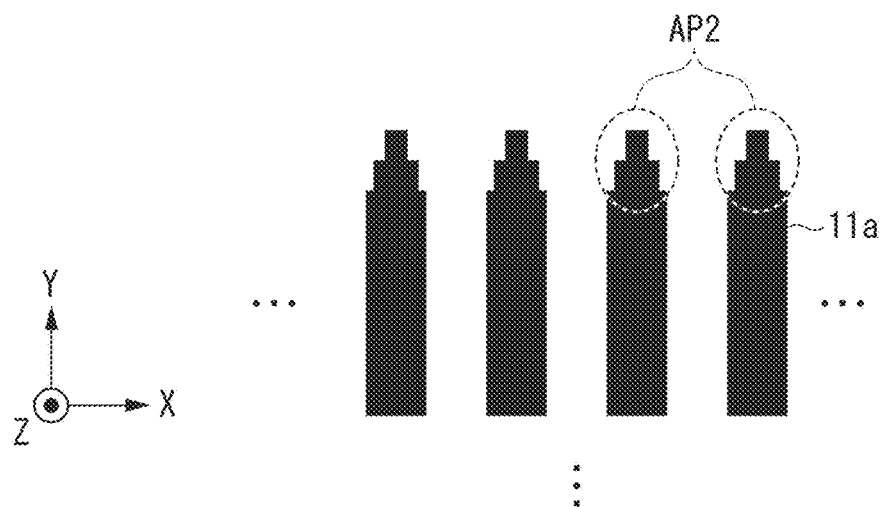

A fifth example will be described. Patterns AP1 and AP2 formed on the diffraction gratings 10a and 11a according to the fifth example will be described as below. FIG. 15A illustrates a part of an alignment mark (mold side mark 10) on which the pattern AP1 (third pattern) is formed at an edge of the diffraction grating 10a in the non-measurement direction. FIG. 15B illustrates a part of an alignment mark (substrate side mark 11) on which the pattern AP2 (third pattern) is formed at an edge of the diffraction grating 11a in the non-measurement direction. The patterns AP1 and AP2 formed on the alignment marks are disposed with the same period as the period of the patterns of the diffraction gratings 10a and 11a in the measurement direction. On the other hand, the line width of the patterns AP1 and AP2 in the measurement direction is gradually decreased with increasing distance from the diffraction gratings 10a and 11a. As illustrated in FIG. 15A, the line width of the patterns AP1 and AP2 in the non-measurement direction may be gradually decreased. When the line width of the patterns AP1 and AP2 is gradually decreased to continuously change the density of the patterns AP1 and AP2, the phase of the light from the patterns can continuously be changed.

Therefore, with the patterns AP1 and AP2 the light (diffracted light and scattered light) from the edges of the diffraction gratings 10a and 11a in the non-measurement direction detected by the detection optical system 21 can be decreased (reduced). Since the line width of the patterns illustrated in FIGS. 15A and 15B more continuously changes than the line width of the patterns illustrated in FIGS. 14A and 14B, the light (diffracted light and scattered light) from the patterns AP1 and AP2 illustrated in FIGS. 15A and 15B can be reduced to a further extent than the light (diffracted light and scattered light) from the edges of the diffraction gratings 10a and 11a in the non-measurement direction illustrated in FIGS. 14A and 14B.

A sixth example will be described. A pattern AP2 formed on the diffraction grating 11a according to the sixth example will be described below. FIG. 16A illustrates a part of an alignment mark (substrate side mark 11) on which the pattern AP2 (third pattern) is formed at an edge of the diffraction grating 11a in the non-measurement direction. Although, in the sixth example, the pattern AP1 formed on the diffraction grating 10a is not illustrated, the pattern AP1 formed on the diffraction grating 10a is similar to the pattern AP2. As illustrated in FIG. 16A, the pattern AP2 formed on the alignment mark is formed with the same width as the width of the pattern of the diffraction grating 11a in the measurement direction. On the other hand, the line width of the pattern AP2 in the non-measurement direction is gradually decreased with increasing distance from the diffraction grating 11a. When the line width of the patterns AP1 and AP2 is gradually decreased to continuously change the density of the patterns AP1 and AP2, the phase of the light from the patterns can continuously be changed.

Therefore, with the patterns AP1 and AP2 the light (diffracted light and scattered light) from the edges of the diffraction gratings 10a and 11a in the non-measurement direction detected by the detection optical system 21 can be decreased (reduced).

A seventh example will be described. A pattern AP2 formed on the diffraction grating 11a according to the seventh example will be described below. FIG. 16B illustrates a part of an alignment mark (substrate side mark 11) on which the pattern AP2 (third pattern) is formed at an edge of the diffraction grating 11a in the non-measurement direction. Although, in the seventh example, the pattern AP1 formed on the diffraction grating 10a is not illustrated, the pattern AP1 formed on the diffraction grating 10a is similar to the pattern AP2. As illustrated in FIG. 16B, the pattern AP2 formed on the alignment mark is disposed with the same period as the period of the pattern of the diffraction grating 11a in the measurement direction. On the other hand, the line width of the pattern AP2 in the measurement direction is gradually decreased with increasing distance from the diffraction grating 11a. Further, in the pattern AP2 in the seventh example, patterns having different line widths are separately disposed in the non-measurement direction. When the line width of the patterns AP1 and AP2 is gradually decreased to continuously change the density of the patterns AP1 and AP2, the phase of the light from the patterns continuously changes.

Therefore, with the patterns AP1 and AP2 the light (diffracted light and scattered light) from the edges of the diffraction gratings 10a and 11a in the non-measurement direction detected by the detection optical system 21 can be decreased (reduced).

Thus, the patterns AP1 and AP2 formed on the diffraction gratings 10a and 11a do not need to be in contact with the edges of the diffraction gratings 10a and 11a in the non-measurement direction. The pattern AP1 is disposed so that the distance between an edge of the diffraction grating 10a in the non-measurement direction and the pattern AP1 (the pattern AP2) does not exceed the resolution of the detection optical system 21. Alternatively, it is also desirable to dispose the pattern AP1 such that the distance does not exceed twice the wavelength (desirably, the distance does not exceed the wavelength) of the light used to detect an alignment mark.

Examples according to the first exemplary embodiment have been described above. Although, according to the first exemplary embodiment, the patterns AP1 and AP2 are formed in both the diffraction grating 10a of the mold side mark 10 and the diffraction grating 11a of the substrate side mark 11, the pattern AP1 or AP2 may be formed on either one of the diffraction gratings 10a and 11a. Further, the patterns AP1 and AP2 of the diffraction gratings 10a and 11a may be different in length in the non-measurement direction. Further, as illustrated in FIG. 16B, a pattern AP3 (fourth pattern) may be formed between patterns configuring the diffraction grating 11a at edges in the non-measurement direction.

Although, in the first exemplary embodiment, the diffraction gratings 10a and 11a have been described as illustrated in FIGS. 7A and 7B, the patterns of the diffraction gratings 10a and 11a may be composed of a plurality of segment SGPs (that is, segment marks made of a set of minute lines and dots), as illustrated in FIG. 16C. In such a case, a pattern may be formed at edges of a plurality of segment SGPs configuring one pattern in the non-measurement direction. Further, a pattern AP1 (AP2) formed at an edge of the diffraction grating 10a in the non-measurement direction may be composed of a plurality of segments. Further, only edges of a diffraction grating 10a in the non-measurement direction may be composed of segment SGPs.

Although in the first exemplary embodiment, the diffraction gratings 10a and 11a have been described, the patterns AP1 and AP2 can be similarly formed at the edges of the diffraction gratings 10b and 11b in the non-measurement direction. In this case, the measurement direction is the Y-axis direction. Further, in each pattern, there are two edges of a diffraction grating in the non-measurement direction. Therefore, the patterns AP1 and AP2 may be formed at two edges, or formed at one edge of each diffraction grating in the non-measurement direction.

In the first exemplary embodiment, a case of dark field detection on the diffraction gratings of the mold side mark 10 and the substrate side mark 11 has been described. Similarly, when performing bright field detection on the above-described diffraction gratings, the alignment mark detection accuracy may be possibly decreased due to the influence of the light (diffracted light and scattered light) from the edges of the diffraction gratings in the non-measurement direction. Therefore, also when performing bright field detection on the diffraction gratings, the light (diffracted light and scattered light) from the edges of the diffraction gratings in the non-measurement direction can be reduced by forming a pattern having a line width smaller than the period of the patterns of the diffraction gratings at the edges of the diffraction gratings in the non-measurement direction. In the first exemplary embodiment, a case where the period of the diffraction grating 10a of the mold side mark 10 is different from the period of the diffraction grating 11a of the substrate side mark 11. However, the period of the diffraction grating 10a may be the same as the period of the diffraction grating 11a. In this case, the relative position between the mold 7 and the substrate 8 is detected by a method other than moire detection.

According to the first exemplary embodiment, a pattern having a line width smaller than the period of the diffraction grating 10a or 11a is formed at the edges of either one of the diffraction grating 10a of the mold side mark 10 and the diffraction grating 11a of the substrate side mark 11 in the non-measurement direction. Accordingly, the generation of intense light (scattered light and diffracted light) from the edges of the diffraction gratings 10a and 11a in the non-measurement direction can be prevented. This allows the detection unit 3 to improve the accuracy of detecting the relative position between the diffraction gratings 10a and 11a. Thus, the imprint apparatus 1 can improve the alignment accuracy by performing the alignment between the mold 7 and the substrate 8 based on the detection result of the alignment marks by the detection unit 3.

Figure 17A:
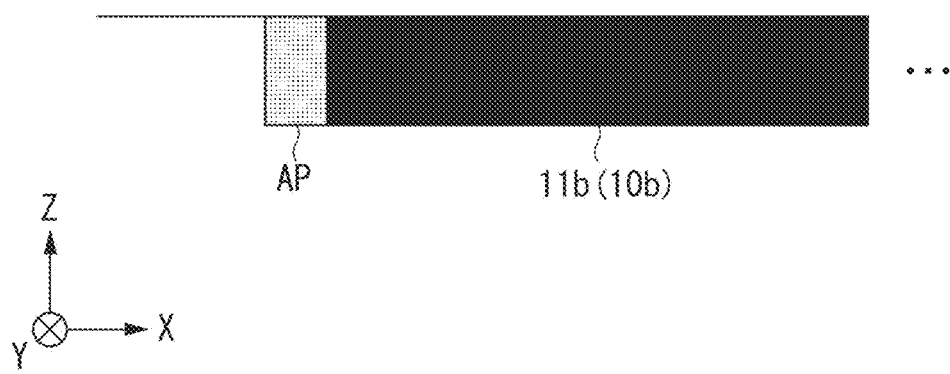
FIGS. 17A and 17B illustrate patterns disposed at edges of diffraction gratings according to a second exemplary embodiment.
Figure 17B:
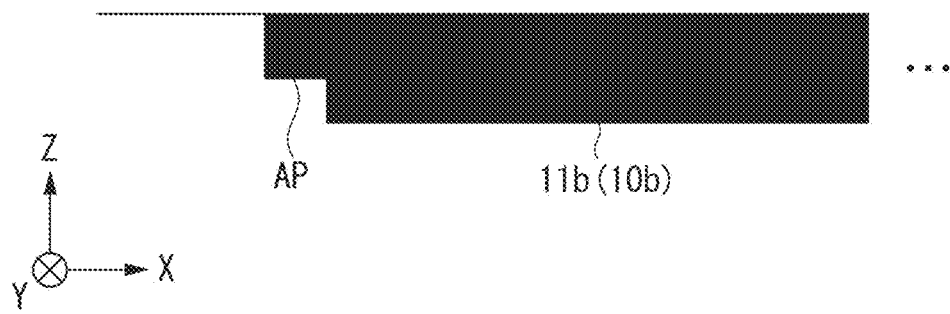
Figure 18A:
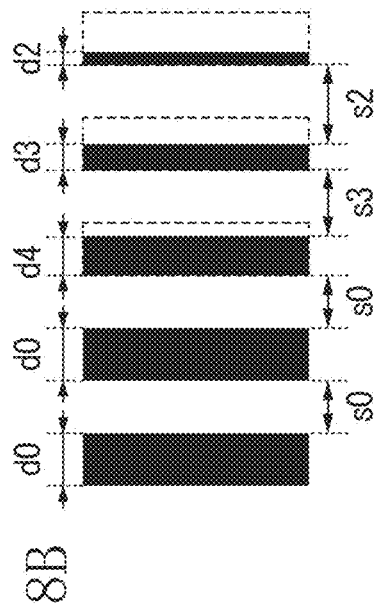
FIGS. 18A to 18D illustrate patterns disposed at edges of diffraction gratings in the measurement direction.
Figure 18B:
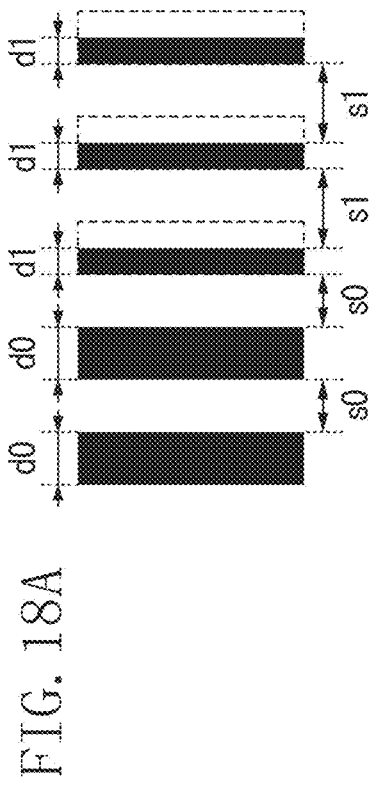
Figure 18C:
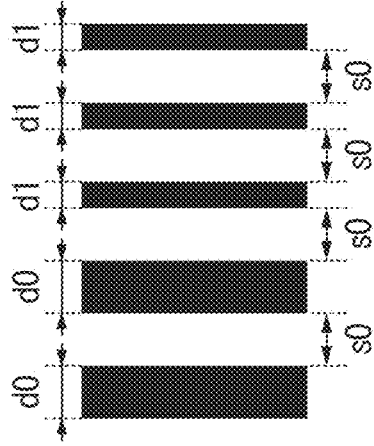
Figure 18D:
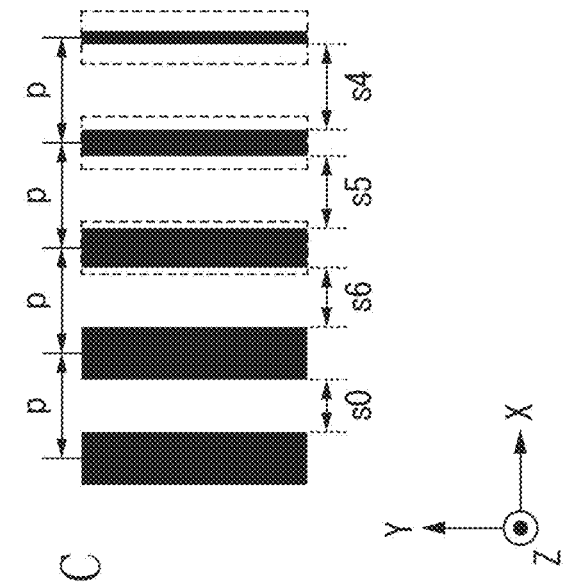

A second exemplary embodiment will be described below with reference to FIGS. 17A and 17B. FIGS. 17A and 17B are sectional views illustrating alignment marks formed on the substrate 8 (or the mold 7) when viewed from the Y-axis direction. The imprint apparatus and the imprint method according to the second exemplary embodiment are similar to the imprint apparatus 1 and the imprint method according to the first exemplary embodiment, respectively.

To reduce the light (scattered light and diffracted light) from the edges of the diffraction gratings 11b (10b) of the alignment marks in the non-measurement direction, it is necessary to generate light having a different phase from that of the diffraction gratings 11b(10b) at the edges of the diffraction gratings 11b(10b) in the non-measurement direction. Therefore, it is necessary to form a pattern having a structure for generating light having a different phase from that of the light from the diffraction gratings 11b(10b) at the edges of at least either one of the diffraction gratings 11b and 10b formed on the mold 7 and the substrate 8 in the non-measurement direction.

As illustrated in FIG. 17A, in the diffraction gratings 11b(10b) of the alignment marks according to the second exemplary embodiment, there is a difference in refractive index between the substance configuring the patterns of the diffraction gratings 11b (10b) and the substance configuring a pattern AP at the edges of the diffraction gratings 11b(10b) in the non-measurement direction. Alternatively, as illustrated in FIG. 17B, there may be a difference in thickness (height in the Z-axis direction) between the substance configuring the patterns of the diffraction gratings 11b (10b) and the substance configuring a pattern AP formed at the edges of the diffraction gratings 11b in the non-measurement direction. Further, a step-height depth may be differentiated between a concavity-and-convexity shape configuring the patterns of the diffraction gratings 11b and a concavity-and-convexity shape configuring the patterns AP formed at the edges of the diffraction gratings 11b in the non-measurement direction.

The refractive index, the thickness of the substance, or the step-height depth of the concavity-and-convexity shape configuring the patterns formed at the edges of the diffraction gratings 11b(10b) in the non-measurement direction may be gradually or continuously changed with increasing distance from the diffraction gratings 11b(10b). When the pattern is continuously changed in this way, the light (scattered light and diffracted light) from the edges of the diffraction gratings 11b in the non-measurement direction can be further reduced.

While the present invention has specifically been described based on the above-described exemplary embodiments, the present invention, naturally, is not limited thereto but can be modified in diverse ways within the scope of the appended claims. The configurations of the diffraction gratings and the patterns at the edges of the diffracting gratings 11b in the non-measurement direction according to the first and the second exemplary embodiments may be suitably combined.

For example, patterns having different pattern widths and different pattern periods as illustrated in FIGS. 18A to 18D may be formed at the edges of the diffraction gratings in the measurement direction according to the above-described exemplary embodiments.

As illustrated in FIGS. 18A to 18D, by decreasing the line width at the edges (edges in the measurement direction) of the patterns of the diffraction gratings, a signal (unnecessary light) occurring at both edges (edges in the measurement direction) of the patterns of the diffraction gratings can be reduced. Further, the pattern interval at the edges (edges in the measurement direction) of the patterns of the diffraction gratings may be widened. By making the intervals (S1 to S6) of marks at edges larger than the interval (S0) of marks of the diffraction gratings used to measure the relative position, a signal (unnecessary light) occurring at both edges (edges in the measurement direction) of the patterns of the diffraction gratings can be reduced. By combining such marks, unnecessary light from the edges of the diffraction gratings in the measurement and the non-measurement directions can be reduced, and alignment mark detection accuracy can be improved.

(Product Manufacturing Method)

A manufacturing method of devices (semiconductor integrated circuit elements, liquid crystal display elements, etc.) as products includes the process of forming a pattern on a substrate (wafer, glass plate, and film-like plate) using the above-described imprint apparatus 1. Further, the manufacturing method may include the process of etching the substrate with a pattern formed thereon. An example of the product manufacturing method is shown in FIGS. 2A-2F and has already been described above. When other products such as patterned media (recording media) and optical elements are manufactured, the manufacturing method may include, instead of etching, other processes for processing the substrate with the pattern formed thereon.

A cured material pattern formed by using the imprint apparatus 1 is permanently used for at least a part of various products or temporarily used when manufacturing various products. Products include electrical circuit elements, optical elements, micro electro mechanical systems (MEMS's), recording elements, sensors, and molds.

Electrical circuit elements include volatile and nonvolatile semiconductor memories such as dynamic random access memories (DRAM), static random access memories (SRAM), flash memories, and magnetoresistive random access memories (MRAM), and semiconductor devices such as large scale integrated circuits (LSIs), charge coupled device (CCD) sensors, image sensors, and field-programmable gate arrays (FPGAs). Optical elements include micro lenses, light guides, wave guides, antireflection films, diffraction gratings, polarization elements, color filters, light emitting elements, displays, and solar cells. MEMS's include digital mirror devices (DMDs), micro channels, and electromechanical conversion elements. Recording elements include optical discs such as compact discs (CDs) and digital versatile discs (DVDs), magnetic disks, magneto-optical disks, and magnetic heads. Sensors include magnetic sensors, optical sensors, and gyro sensors. Molds include molds for imprint.

The cured material pattern is used as it is or temporarily used as a resist mask, as at least a part of component members of the above-described products. A resist mask is removed after etching or ion implantation is completed in the substrate working process.

In comparison with the conventional method, the product manufacturing method according to the present exemplary embodiment is advantageous in at least one of the performance, quality, productivity, and production cost of products.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-094830, filed May 10, 2016, which is hereby incorporated by reference herein in its entirety.

What is claimed is:

1. A position detector comprising:
    a detection unit configured to detect a moire formed by a first light diffracted by a first diffraction grating and a second light diffracted by a second diffraction grating, the first diffraction grating including a first pattern disposed in a first direction, and the second diffraction grating including a second pattern disposed in the first direction; and
    a control unit configured to obtain a relative position between the first and the second diffraction gratings based on the moire detected by the detection unit,
    wherein the detection unit further detects a third light diffracted by a third pattern formed in a second direction different from the first direction at edges of the first pattern of the first diffraction grating, the third pattern having a width smaller than a width of the first pattern of the first diffraction grating in the first direction.

2. The position detector according to claim 1, wherein the detection unit further detects a fourth light from a fourth pattern formed in the second direction at edges of the second pattern of the second diffraction grating, the fourth pattern having a width smaller than a width of the second pattern of the second diffraction grating in the first direction.

3. The position detector according to claim 1, wherein widths of the first and second patterns disposed in the first direction used to obtain the relative position are identical.

4. The position detector according to claim 1, wherein the width of the third pattern in the first direction is smaller than a half of the width of the first pattern in the first direction.

5. The position detector according to claim 1, wherein at least one of the first and the second diffraction gratings includes a fourth pattern formed in the second direction.

6. The position detector according to claim 1, wherein the first pattern is composed of a plurality of segments.

7. The position detector according to claim 1, further comprising an illumination optical system configured to illuminate the first and the second diffraction gratings with light perpendicular to the first direction and illuminate the first diffraction grating with light parallel to the first direction.

8. The position detector according to claim 1, wherein an intensity spectrum of the moire formed by the first light and the second light and the third light detected by the detection unit is substantially the same at the edges and the center of the first and second diffraction gratings in the second direction.

* * * * *